United States Patent
Tzu (10) Patent No.: US 7,859,123 B2
(45) Date of Patent: Dec. 28, 2010

(54) WIRE BONDING STRUCTURE AND MANUFACTURING METHOD THEREOF

(75) Inventor: Chung Hsing Tzu, Taipei County (TW)

(73) Assignee: Great Team Backend Foundry Inc., Tortola (VG)

( * ) Notice: Subject to any disclaimer, the term of this patent is extended or adjusted under 35 U.S.C. 154(b) by 97 days.

(21) Appl. No.: 12/358,604

(22) Filed: Jan. 23, 2009

(65) Prior Publication Data

US 2010/0072619 A1    Mar. 25, 2010

Related U.S. Application Data

(60) Provisional application No. 61/098,292, filed on Sep. 19, 2008.

(51) Int. Cl.
*H01L 23/48* (2006.01)
*H01L 23/52* (2006.01)
*H01L 29/40* (2006.01)

(52) U.S. Cl. .................. 257/781; 257/780; 257/784

(58) Field of Classification Search ................ 257/784, 257/786, 780, 781
See application file for complete search history.

(56) References Cited

U.S. PATENT DOCUMENTS 6,815,789 B2 * 11/2004 Tiziani et al. ............... 257/459
7,417,324 B2 *  8/2008 Obiya ........................ 257/780

* cited by examiner

*Primary Examiner*—S. V Clark
(74) *Attorney, Agent, or Firm*—Rosenberg, Klein & Lee (57) ABSTRACT

The present invention relates to a wire bonding structure, and more particularly to a manufacturing method for said wire bonding structure. The wire bonding structure comprises a die that connects with a lead via a bonding wire. At least one bond pad is positioned on an active surface of the die, and a gold bump is provided on the bond pad; furthermore, a ball bond can be positioned upon the gold bump. The bond pad and the gold bump can separate the ball bond and the die, which can avoid damaging the die during the bonding process.

5 Claims, 13 Drawing Sheets

WIRE BONDING STRUCTURE AND MANUFACTURING METHOD THEREOF

CROSS REFERENCE TO RELATED APPLICATIONS

This application claims priority of U.S. Provisional Application No. 61/098,292 filed on 19 Sep. 2008 under 35 U.S.C. §119(e), the entire contents of all of which are hereby incorporated by reference.

FIELD OF THE INVENTION

The present invention relates to a wire bonding structure, and more particularly to a manufacturing method for said wire bonding structure.

BACKGROUND

Figure 1:
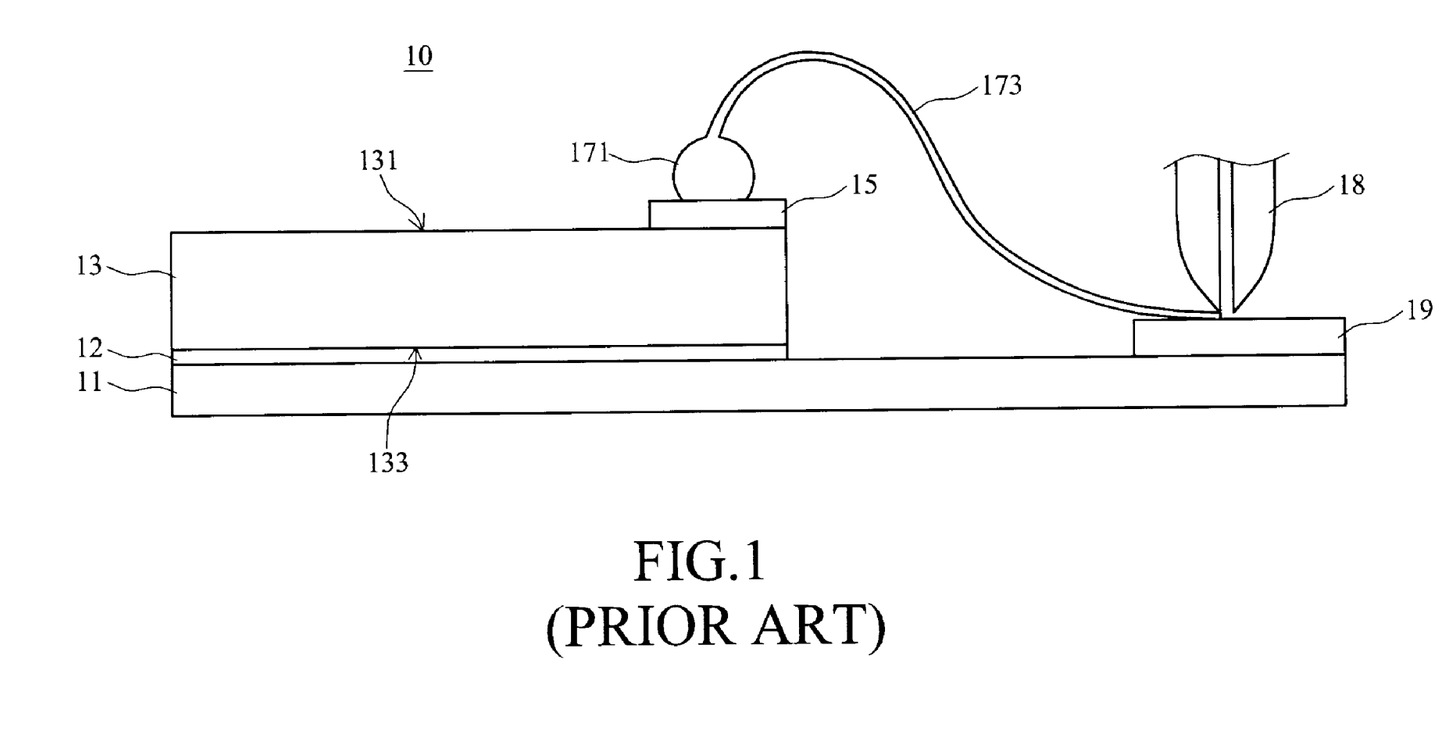
FIG. 1 is a diagrammatic illustration of a wire bonding structure in accordance with a prior art.

FIG. 1 is a diagrammatic illustration of a wire bonding structure in accordance with a prior art. The typical wire bonding structure 10 comprises a substrate 11 and a die 13. The die 13 comprises an active surface 131 and a back surface 133, and is positioned on the top surface of the substrate 11. A bond pad 15 is positioned on the active surface 131 of the die 13, and connected with a lead 19 by means of a ball bond 171 and a bonding wire 173.

In the manufacturing process of wire bonding structure 10, the die 13 can be positioned on the top surface of the substrate 11 by means of an adhesive layer 12. For example, the back surface 133 of the die 13 can connect with the top surface of the substrate 11 via the adhesive layer 12. Thereafter, a capillary 18 can be used to form the ball bond 171 on the bond pad 15, and then form the bonding wire 173 to connect the ball bond 171 and the lead 19.

In general, the ball bond 171 and the bonding wire 173 are both made of copper, so that the cost of the manufacturing process of the bonding structure 10 can be reduced. However, damage to the die 13 or the bond pad 15 may occur during the bonding process. For example, heat can be generated when the ball bond 171 is formed on the bond pad 15, and in turn damage the die 13 and cause a reduction in the yield of the wire bonding structure 10.

SUMMARY OF THE INVENTION

It is the primary objective of the present invention to provide a wire bonding structure, wherein a bump is positioned between the bond pad and the ball bond, and the ball bond shall not touch the bond pad or the die to avoid damage to the die and/or the bond pad during the bonding process.

It is a secondary objective of the present invention to provide a wire bonding structure, wherein the bump is made of gold, and the hardness of said gold is much lower than that of copper, tin, or aluminum, which can maintain the structure and the functionality of the die during the bonding process.

It is another objective of the present invention to provide a wire bonding structure, wherein the bump is positioned between the bond pad and the ball bond to increase the distance between the ball bond and the bond pad, which can improve the yield of the wire bonding structure.

It is another objective of the present invention to provide a manufacturing process for the wire bonding structure, wherein a capillary can be used to form the ball bond and the bonding wire, and the efficiency of the bonding process can be improved.

It is another objective of the present invention to provide a manufacturing process for the wire bonding structure. A gold bump can be formed on the bond pad before bonding the ball bond and the bonding wire, which thus avoids the ball bond directly touching the bond pad.

In an aspect of the present invention, a wire bonding structure is provided, comprising: a die comprising a first surface and a second surface; a bond pad positioned on said first surface of the die; a bump positioned on the bond pad, wherein the bump comprises gold; a ball bond positioned on the bump; and a bonding wire connecting the ball bond and a lead.

In an aspect of the present invention, a wire bonding structure is provided, comprising: at least one first bond pad positioned on a first die; at least one second bond pad positioned on a second die; a first bump positioned on the first bond pad; a second bump positioned on the second bond pad, wherein the first bump and the second bump both comprise gold; a ball bond positioned upon the first bump; and a bonding wire connecting the ball bond and the second bump.

In an aspect of the present invention, a manufacturing method of a wire bonding structure including a bond pad positioned on a die is provided, comprising the steps of: forming a bond pad on a die; forming a bump on the bond pad, wherein the bump comprises gold; forming a ball bond on the bump; and forming a bonding wire to connect the ball bond and a lead.

DETAILED DESCRIPTION

Figure 2:
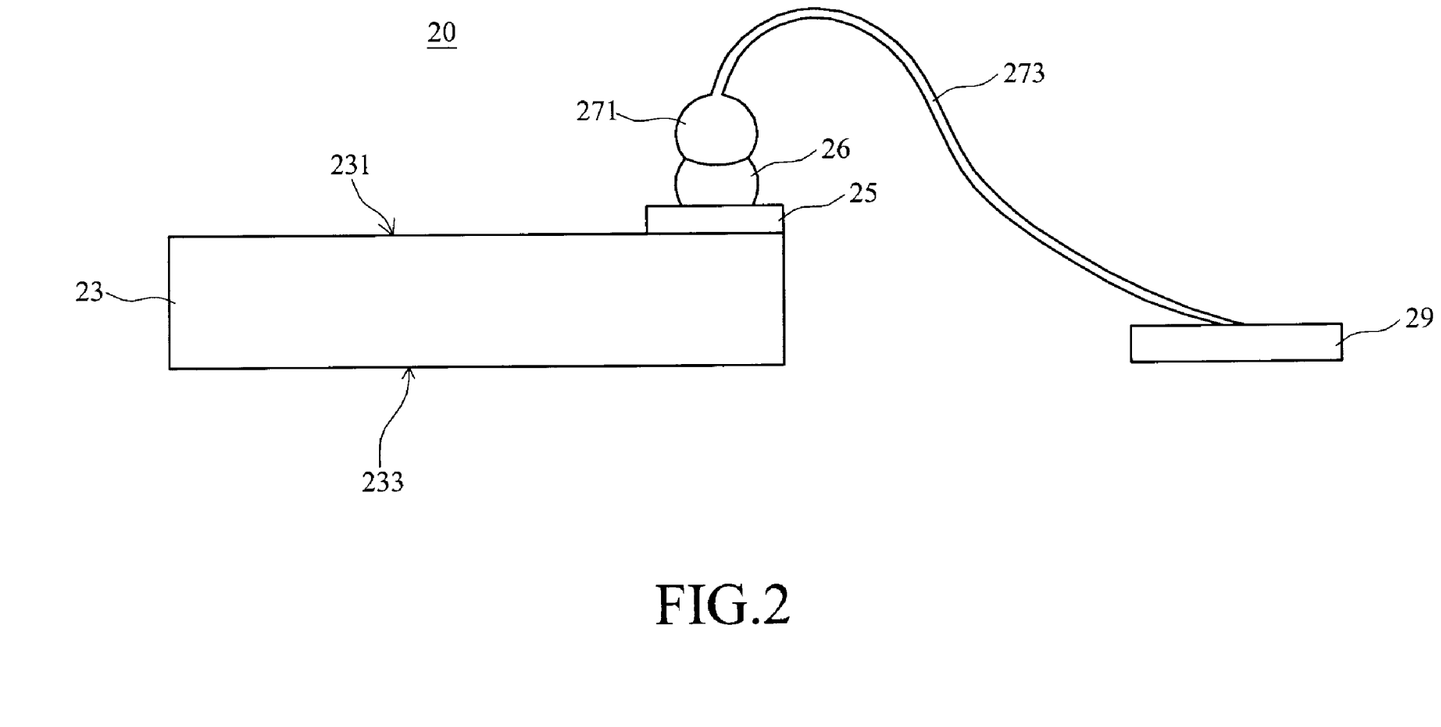
FIG. 2 is a diagrammatic illustration of a wire bonding structure in accordance with an embodiment of the invention.

Referring to FIG. 2, there is shown a diagrammatic illustration of a wire bonding structure in accordance with an embodiment of the invention. The wire bonding structure 20 comprises a die 23 that connects with a first bond pad 29 via a bonding wire 273. Further, the die 23 comprises a first surface 231 and a second surface 233, wherein the first surface 231 can be an active surface and the second surface 233 can be a back surface.

There is at least one bond pad 25 positioned on the first surface 231 of the die 23, and a bump 26 is positioned on the bond pad 25, wherein the bump 26 can be made of gold. A ball bond 271 can be positioned upon the bump 26, and connected with the first bond pad 29 by means of a bonding wire 273.

In one embodiment of the invention, the ball bond 271 and the bonding wire 273 can be made of copper, tin, or aluminum, and so on. The hardness of gold is much lower than that of copper, tin, and aluminum, so by using gold damage to the bond pad 25 and/or die 23 can be avoided during the process of forming gold bump 26. Moreover, the ball bond 271 is formed upon the bump 26 and does not touch the bond pad 25 and/or the die 23, so that the structure and function of the die 23 and/or the bond pad 25 can be maintained after bonding the ball bond 271 and the bonding wire 273 on the bump 26.

Figure 3A:
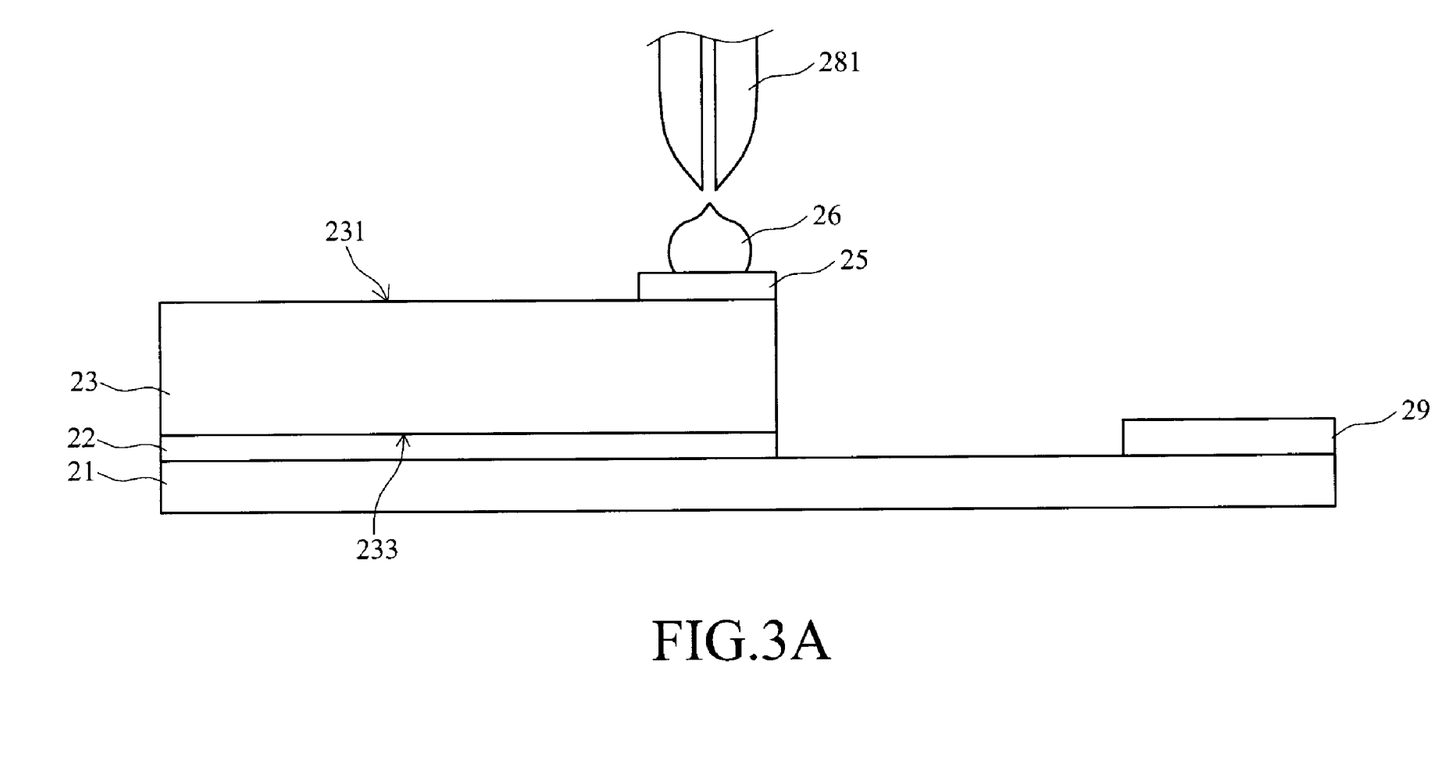
FIG. 3A to FIG. 3C are diagrammatic illustrations of the manufacturing process of a wire bonding structure in accordance with an embodiment of the invention.
Figure 3B:
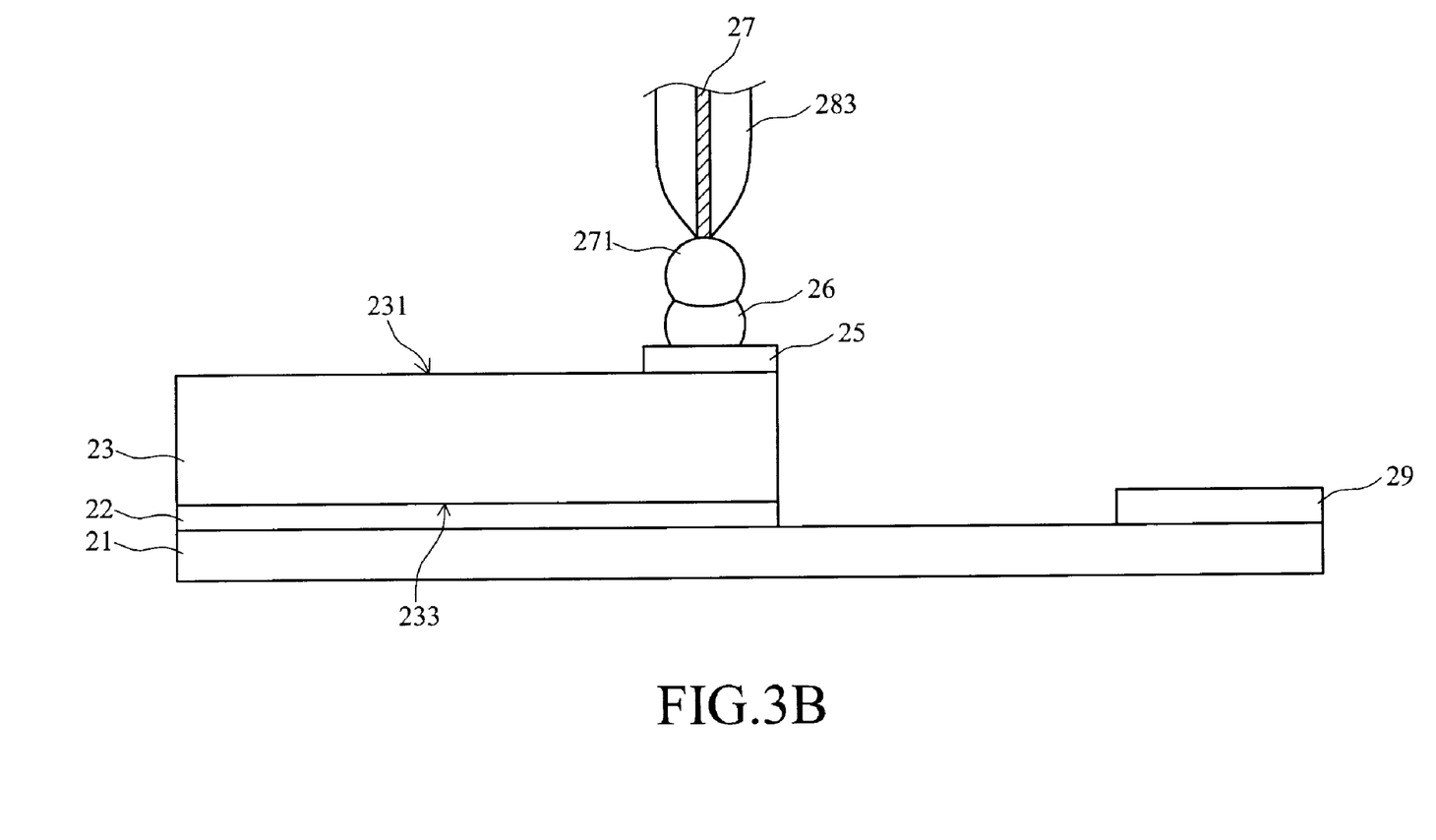
Figure 3C:
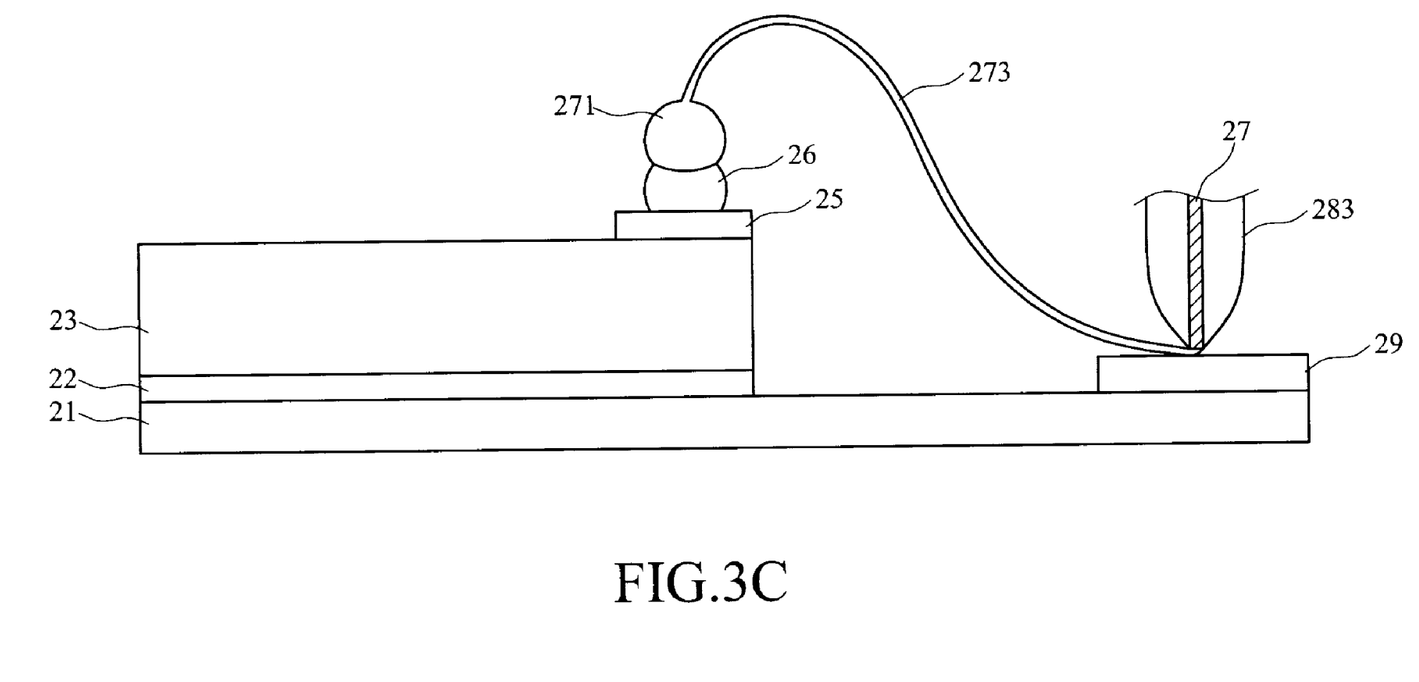

Referring to FIG. 3A to FIG. 3C, there are shown diagrammatic illustrations of the manufacturing process of a wire bonding structure in accordance with an embodiment of the invention. There is a bond pad 25 positioned on the first surface 231 of the die 23, and a bump 26 can be formed on the bond pad 25 by ultrasonic vibration of metal diffusion technology. For example, a capillary 281 can be used to form the bump 26 on the bond pad 25, wherein the bump 26 is made of gold, as shown in FIG. 3A. In addition, the bump 26 also can be formed on the bond pad 25 by plating technology.

A capillary 283 can be used to form a ball bond 271 upon the bump 26, as shown in FIG. 3B. For example, a wire 27 is carried through the capillary 283, and threaded through the capillary 283 for use in the bonding process. The end of the wire 27 protruding from the capillary 283 is heated to a molten state by way of an electrical discharge or a hydrogen torch; the capillary 283 presses the molten wire 27 against the bump 26 to form the ball bond 271 upon the bump 26.

The capillary 283 can be used to form a bonding wire 273 to connect the ball bond 271 and the lead 29, as shown in FIG. 3C. For example, after forming the ball bond 271 on the bump 26, the capillary 283 can be moved from the bump 26 to the lead 29, and the wire 27 is pressed against the lead 29, thereby forming the bonding wire 273 between the bump 26 and the lead 29. In addition, the wire 27 can be a copper wire, tin wire, or aluminum wire, and the ball bond 271 and the bonding wire 273 can both be made of copper, tin, or aluminum.

The die 23, the bond pad 25, and the lead 29, may be heated during the bonding process for the benefit of melting the wire 27. The capillary 283 may include an ultrasonic vibration unit to form the ball bond 271 and the bonding wire 273. Furthermore, a capillary with metal diffusion technology may be used to form the ball bond 271 and the bonding wire 273.

The bump 26 is made of gold. As the hardness of gold is much lower than that of copper, tin, or aluminum, damage can be avoided to the die 23 and/or the bond pad 25 as the gold bump 26 is formed on the bond pad 25. Otherwise, the bump 26 formed on the bond pad 25 can act as a buffer structure, so that the ball bond 271 cannot touch the bond pad 25 and/or the die 23 directly during the bonding process, which can protect the die 23 and/or the bond pad 25 from damage resulting from high temperatures.

In one embodiment of the invention, the die 23 can be positioned on the top surface of a substrate 21. For example, the second surface 233 of the die 23 can connect with the top surface of the substrate 21 via an adhesive layer 22, and the lead 29 may be positioned on the same or different substrate 21. In addition, the substrate 21 can also be a leadframe, and the die 23 and/or the lead 29 can be positioned on the leadframe.

Figure 4:
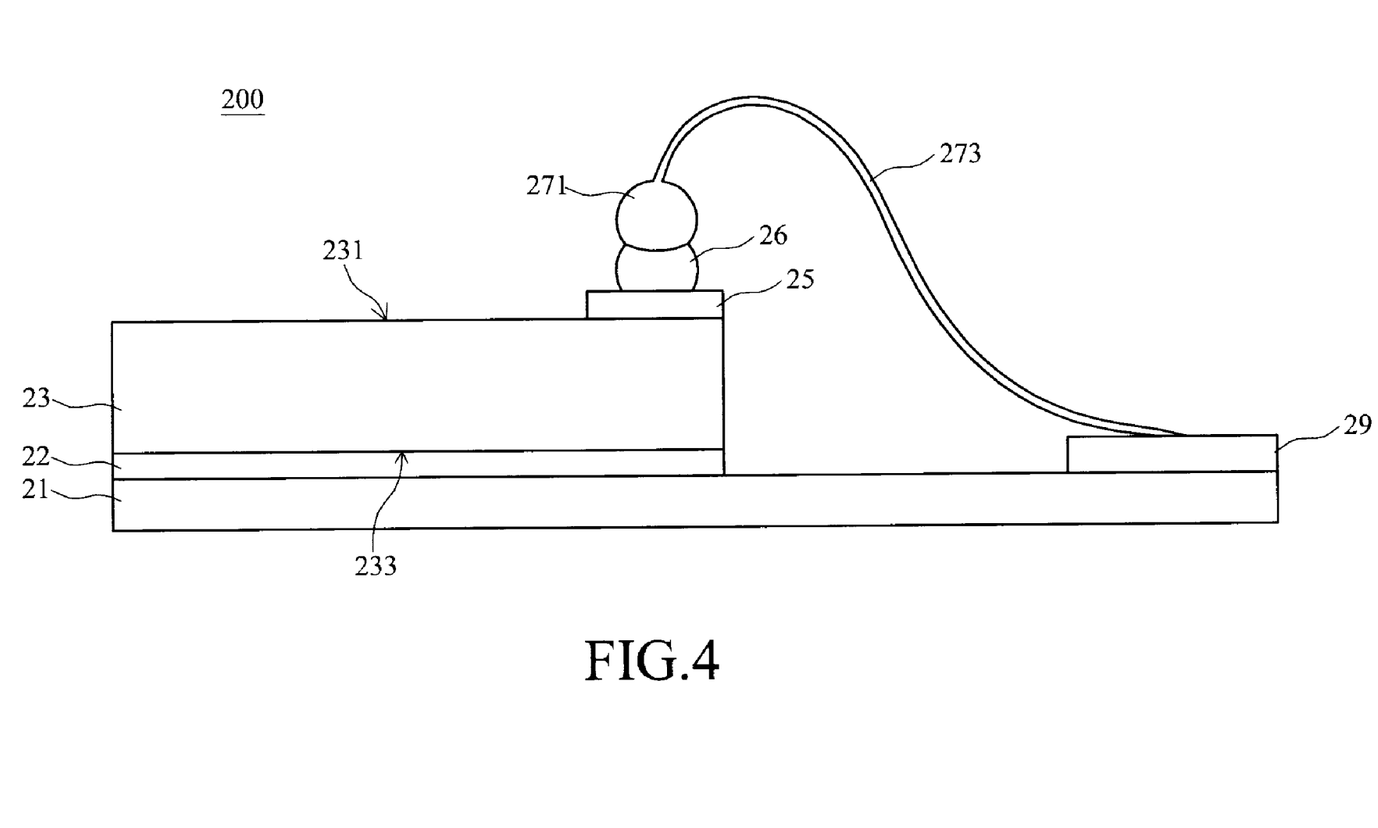
FIG. 4 is a diagrammatic illustration of a wire bonding structure in accordance with an embodiment of the invention.

Referring to FIG. 4, there is shown a diagrammatic illustration of a wire bonding structure in accordance with an embodiment of the invention. The wire bonding structure 200 comprises a die 23 and a substrate 21, and the die 23 may connect with the substrate 21 via an adhesive layer 22. Further, the die 23 comprises a first surface 231 and a second surface 233, wherein the first surface 231 can be an active surface and the second surface 233 can be a back surface.

There are a lead 29 and a bond pad 25 positioned on the substrate 21 and the first surface 231 of the die 23 respectively. A bump 26 that is made of gold can be positioned on the bond pad 25. Furthermore, a ball bond 271 can be positioned upon the bump 26, and connected with the lead 29 by means of a bonding wire 273.

Figure 5:
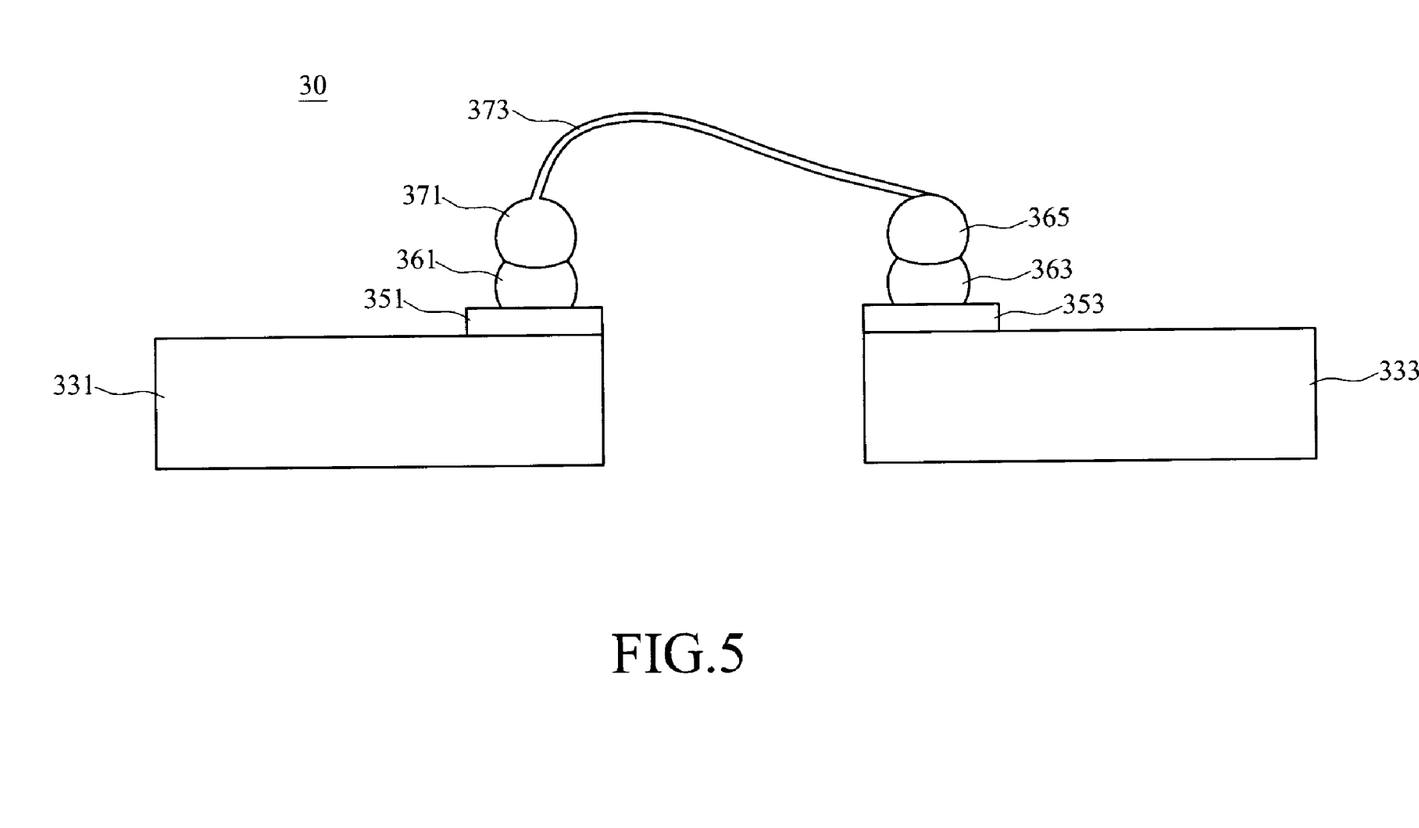
FIG. 5 is a diagrammatic illustration of a wire bonding structure in accordance with an embodiment of the invention.

Referring to FIG. 5, there is shown a diagrammatic illustration of a wire bonding structure in accordance with an embodiment of the invention. The wire bonding structure 30 comprises a first die 331 and a second die 333 that connect to each other. There is at least one first bond pad 351 positioned on the first die 331, and at least one second bond pad 353 positioned on the second die 333.

A first bump 361 and a second bump 363 are positioned on the first bond pad 351 and the second bond pad 353 respectively; the first bump 361 and the second bump 363 are both made of gold. A bump 365 is positioned upon the second bump 363, and a ball bond 371 is positioned upon the first bump 361, and the ball bond 371 connects with the bump 365 by means of a bonding wire 373. The ball bond 371 and the bump 365 are both made of copper, tin, or aluminum.

Figure 6:
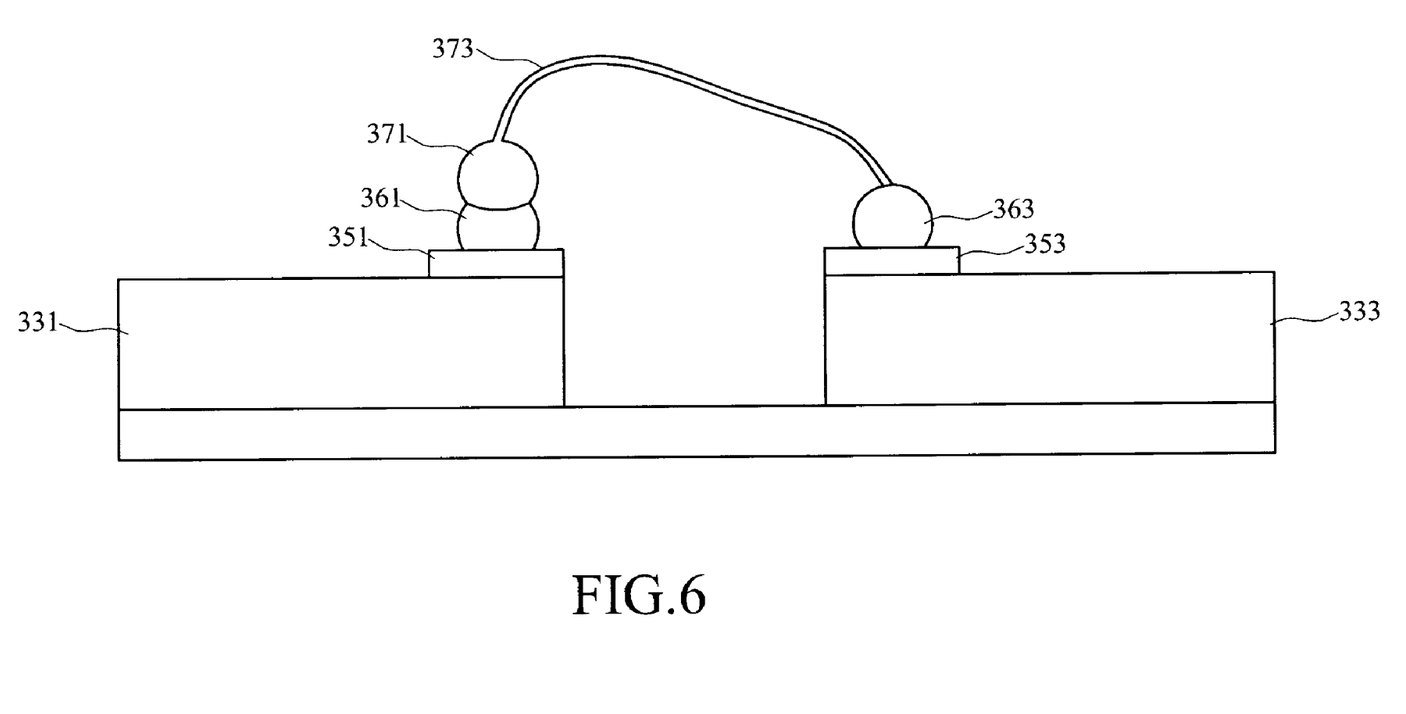
FIG. 6 is a diagrammatic illustration of a wire bonding structure in accordance with an embodiment of the invention.

In another embodiment of the invention, there is no bump 365 positioned upon the second bump 363, and the ball bond 371 can connect with the second bump 363 by means of a bonding wire 373 directly, as shown in FIG. 6.

Figure 7A:
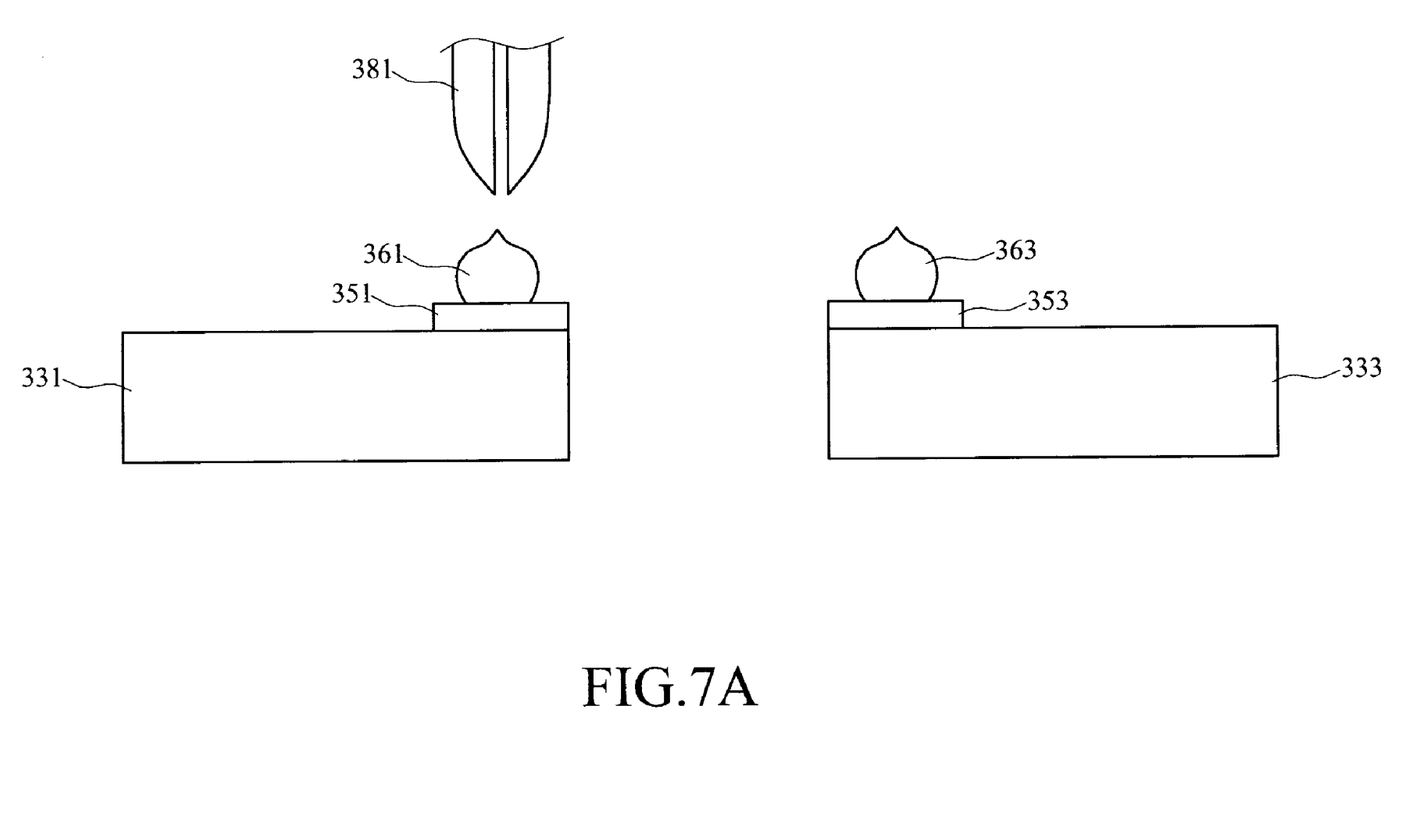
FIG. 7A to FIG. 7D are diagrammatic illustrations of the manufacturing process of a wire bonding structure in accordance with an embodiment of the invention.

Referring to FIG. 7A to FIG. 7D, there are shown diagrammatic illustrations of the manufacturing process of a wire bonding structure in accordance with an embodiment of the invention. The first bond pad 351 and the second bond pad 353 can be positioned on the first die 331 and the second die 333 respectively. Thereafter, a capillary 381 can be used to form the first bump 361 on the first bond pad 351, and form the second bump 363 on the second bond pad 353, wherein the first bump 361 and the second bump 363 are both made of gold, as shown in FIG. 7A.

Figure 7B:
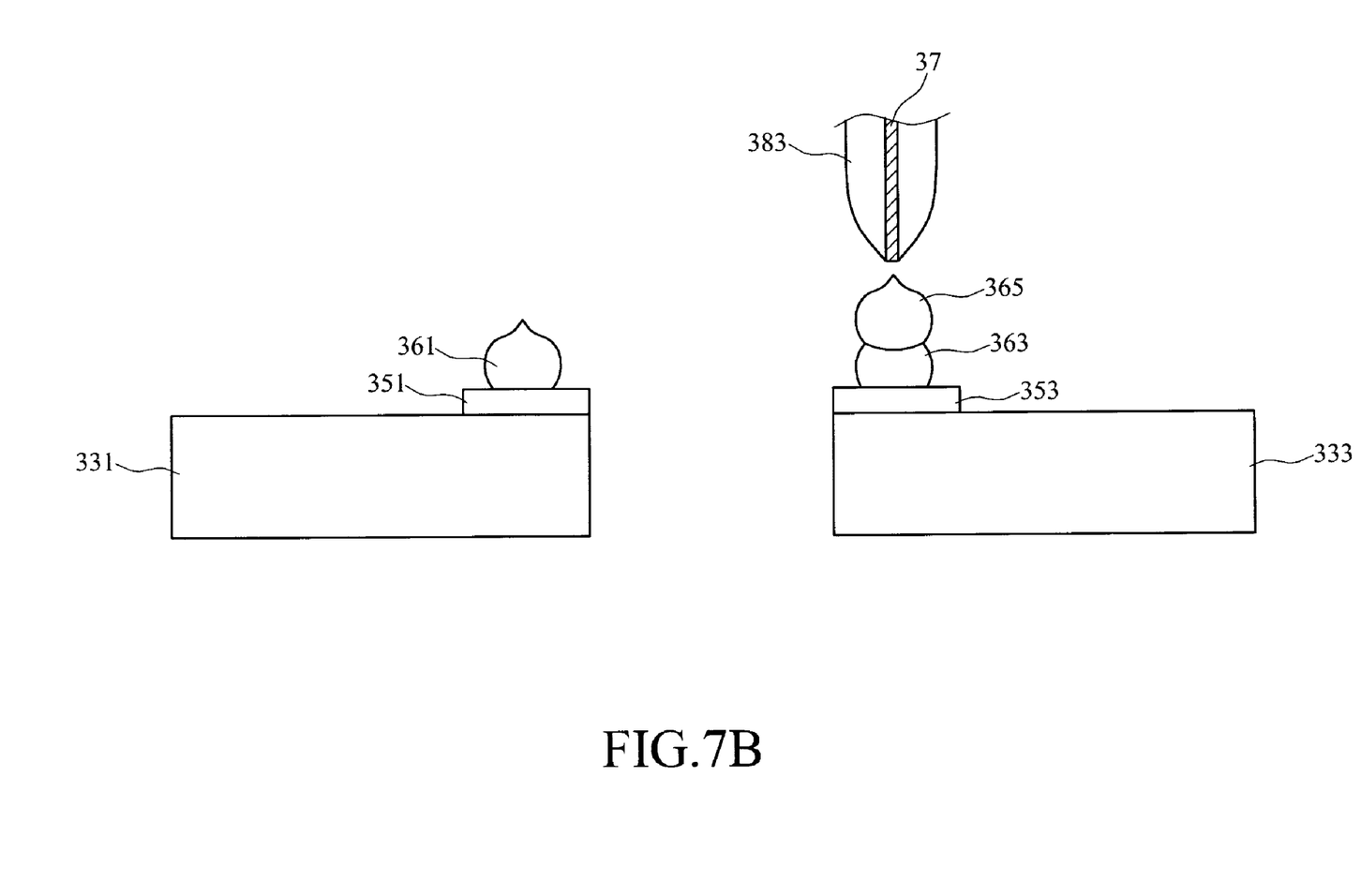
Figure 7C:
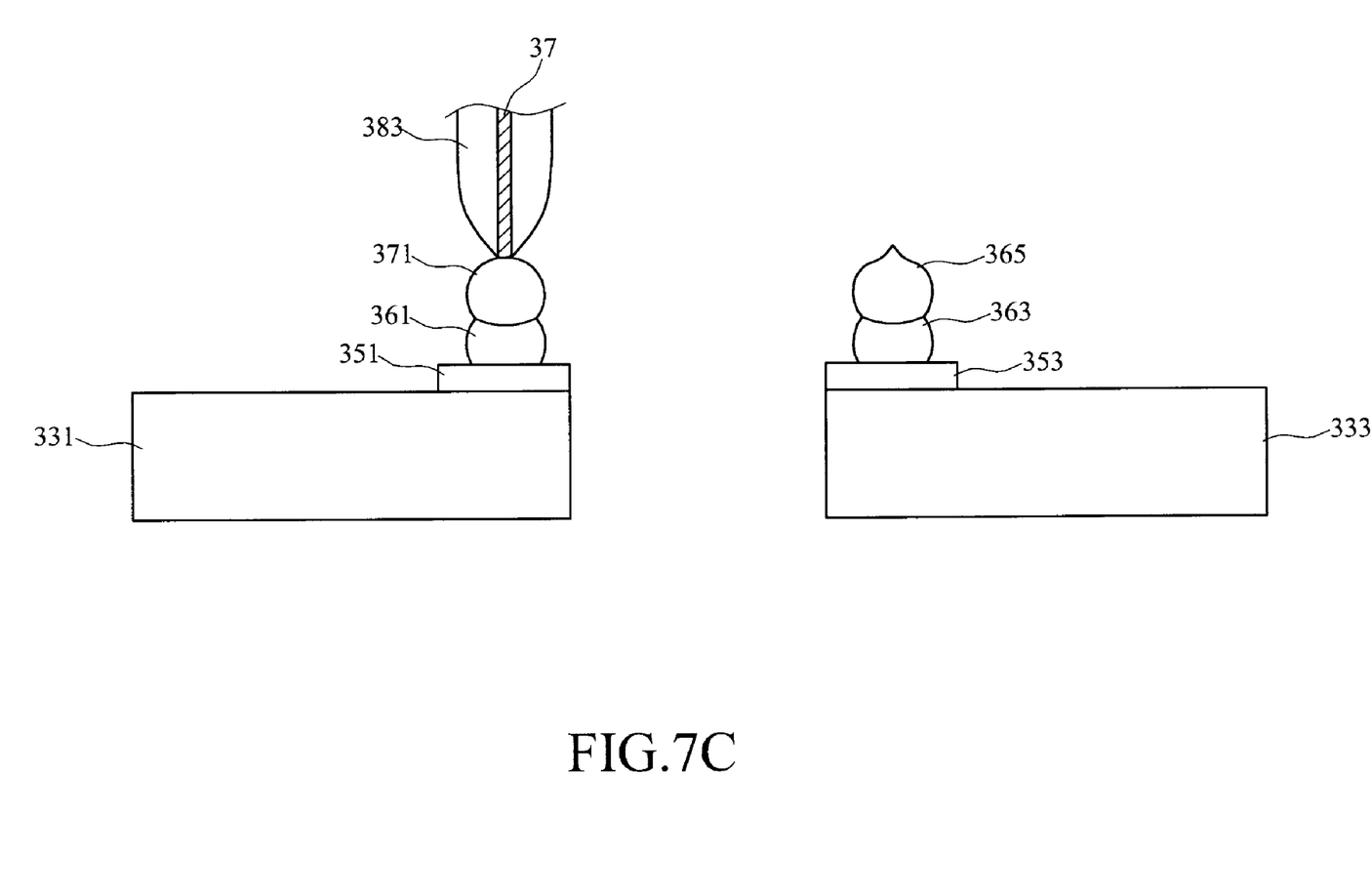

After forming the first bump 361 and the second bump 363, a capillary 383 can be used to form a bump 365 upon the second bump 363, as shown in FIG. 7B. Furthermore, the capillary 383 also can be used to form the ball bond 371 upon the first bump 361, wherein the bump 365 and the ball bond 371 both can be made of copper, tin, or aluminum, as shown in FIG. 7C.

Figure 7D:
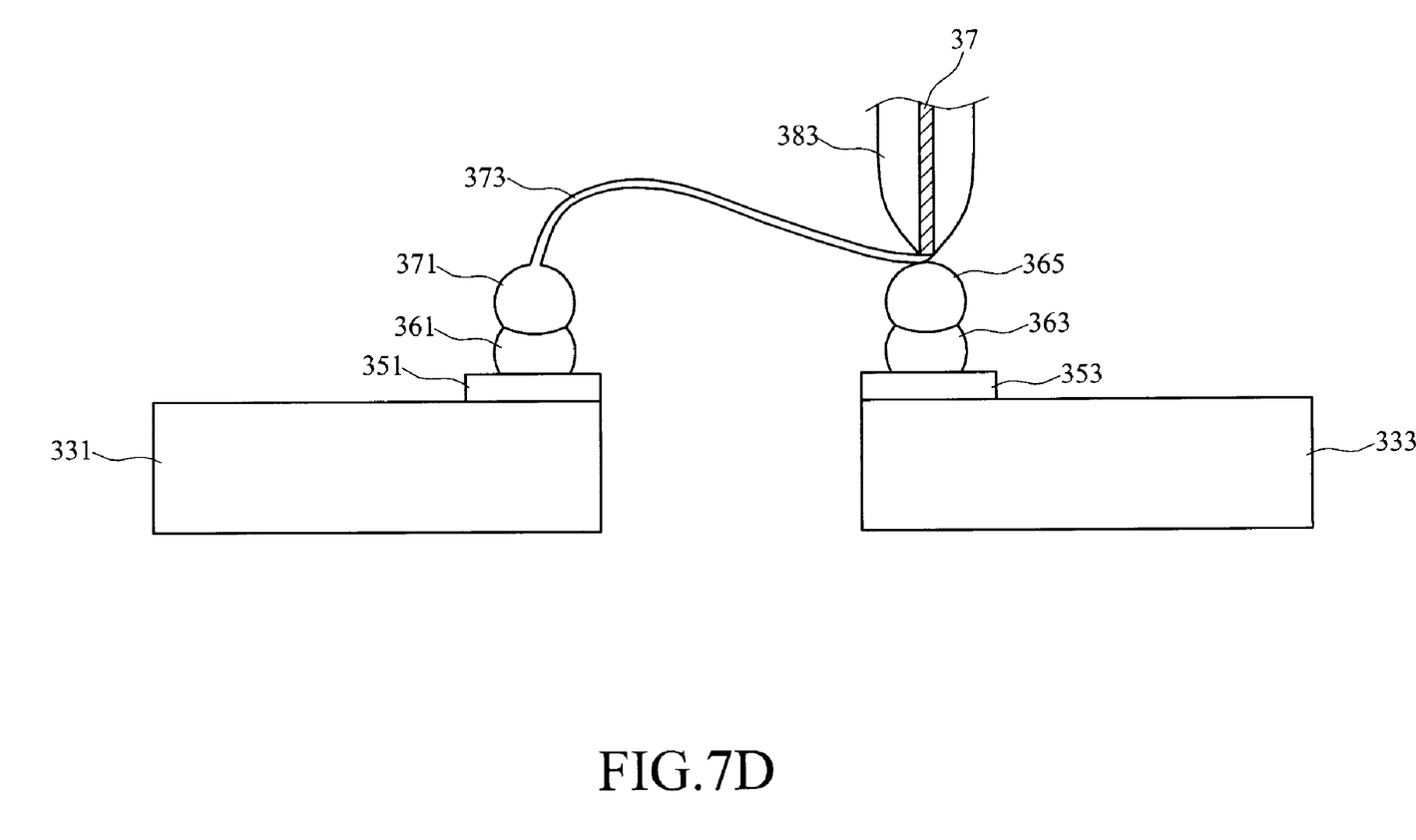

After bonding the ball bond 371 on the first bump 361, the capillary 383 can be moved from the first bump 361 to the bump 365. The wire 37 carried in the capillary 383 can be pressed against the bump 365, thereby forming the bonding wire 373 between the first die 331 and the second die 333, as shown in FIG. 7D. In addition, the wire 37 can be a copper wire, tin wire, or aluminum wire, so that the ball bond 371, the bonding wire 373, and/or the bump 365 can be made of copper, tin, or aluminum.

Figure 8:
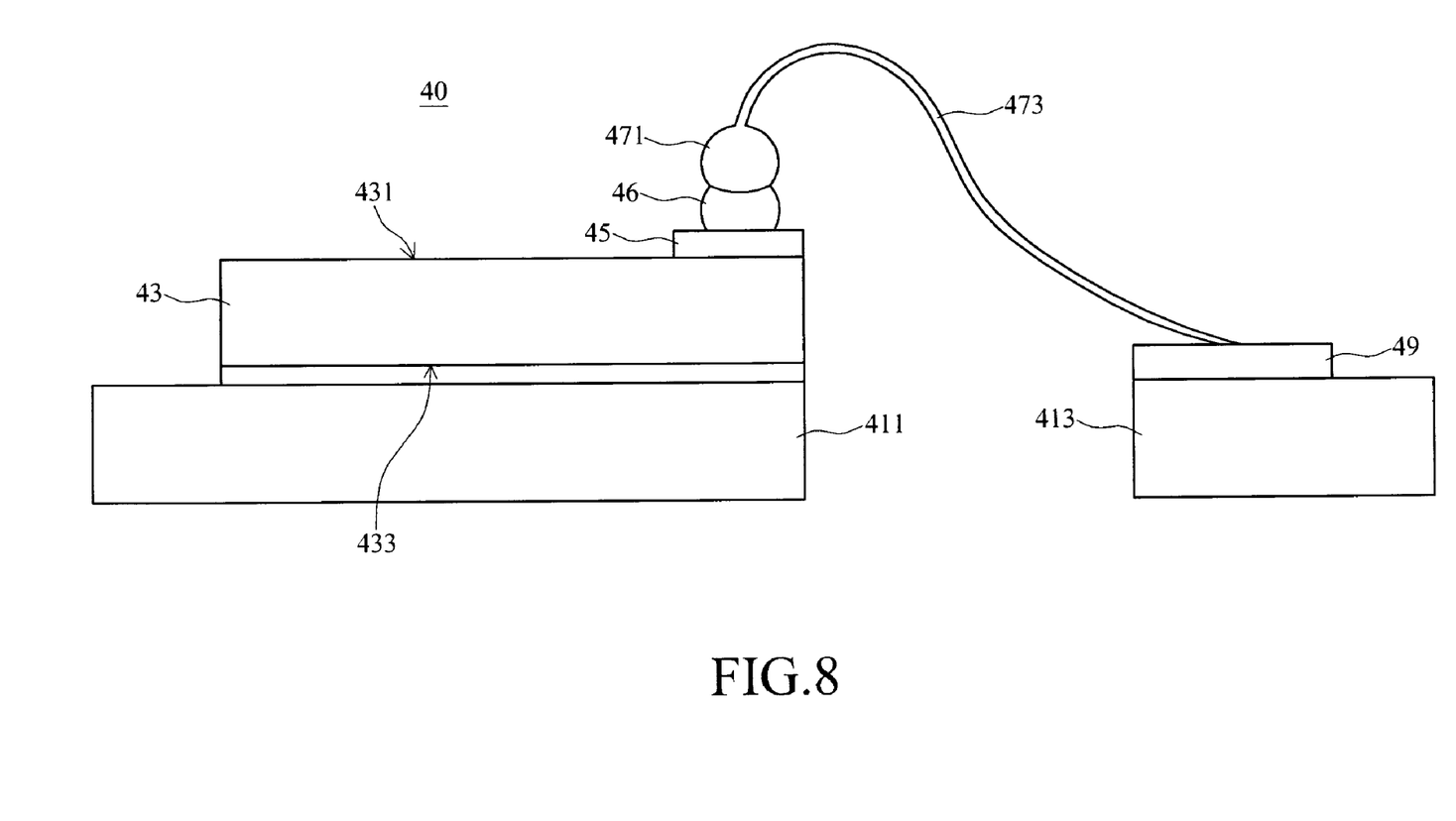
FIG. 8 is a diagrammatic illustration of a wire bonding structure in accordance with an embodiment of the invention.

Referring to FIG. 8, there is shown a diagrammatic illustration of a wire bonding structure in accordance with an embodiment of the invention. The wire bonding structure 40 comprises a die 43 that connects with a lead 49, wherein the die 43 can be positioned on a substrate 411 and the lead 49 can be positioned on a leadframe 413. The die 43 comprises a first surface 431 and a second surface 433; the first surface 431 can be an active surface and the second surface 433 can be a back surface.

There is at least one bond pad 45 positioned on the first surface 431 of the die 43, and a bump 46 positioned on the bond pad 45, wherein the bump 46 can be made of gold. A ball bond 471 can be positioned upon the bump 46, and connected with the lead 49 by means of a bonding wire 473.

The present invention is not limited to the above-described embodiments. Various alternatives, modifications, and equivalents may be used. Therefore, the above embodiments should not be taken as limiting the scope of the invention, which is defined by the appending claims.

The invention claimed is:

1. A wire bonding structure, comprising:
   at least one first bond pad positioned on a first die;
   at least one second bond pad positioned on a second die;
   a first bump positioned on said first bond pad;
   a second bump positioned on said second bond pad, wherein said first bump and said second bump both comprise gold;
   a ball bond positioned upon said first bump; and
   a bonding wire connecting said ball bond and said second bump.

2. The wire bonding structure of claim 1, comprising a bump positioned upon said second bump, and said bonding wire connects to said second bump via said bump.

3. The wire bonding structure of claim 1, wherein the material of said ball bond and said bonding wire is the same.

4. The wire bonding structure of claim 3, wherein the material of said ball bond and said bonding wire is copper, tin, or aluminum.

5. The wire bonding structure of claim 1, wherein a capillary is used to form said ball bond and said bonding wire.

* * * * *